(12) United States Patent
Jiang et al.

(10) Patent No.: US 8,431,475 B2
(45) Date of Patent: Apr. 30, 2013

(54) METHOD FOR FABRICATING A LOW-RESISTIVITY OHMIC CONTACT TO A P-TYPE III-V NITRIDE SEMICONDUCTOR MATERIAL AT LOW TEMPERATURE

(75) Inventors: Fengyi Jiang, Nanchang (CN); Li Wang, Jiang Xi (CN); Wenqing Fang, Jiang Xi (CN); Chunlan Mo, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 0 days.

(21) Appl. No.: 12/159,835

(22) PCT Filed: Aug. 31, 2007

(86) PCT No.: PCT/CN2007/002617
§ 371 (c)(1),
(2), (4) Date: Jul. 1, 2008

(87) PCT Pub. No.: WO2009/026749
PCT Pub. Date: Mar. 5, 2009

(65) Prior Publication Data
US 2010/0219394 A1    Sep. 2, 2010

(51) Int. Cl.
*H01L 33/40* (2010.01)
(52) U.S. Cl.
USPC .................. 438/604; 257/102; 257/E29.144

(58) Field of Classification Search ............ 257/79–103, 257/9–39, 44–47, 188, 189, 613, 615, 745, 257/E29.144; 438/22–47, 597–688
See application file for complete search history.

(56) References Cited

U.S. PATENT DOCUMENTS

| | | | | |
|---|---|---|---|---|
| 5,523,623 A * | 6/1996 | Yanagihara et al. | .......... | 257/745 |
| 6,117,700 A * | 9/2000 | Orita et al. | ....................... | 438/46 |
| 6,287,947 B1 * | 9/2001 | Ludowise et al. | ............. | 438/606 |
| 6,447,604 B1 * | 9/2002 | Flynn et al. | ....................... | 117/89 |
| 6,524,882 B2 * | 2/2003 | Takeya et al. | .................... | 438/93 |
| 6,734,091 B2 * | 5/2004 | Oh et al. | ........................ | 438/605 |
| 7,190,076 B2 * | 3/2007 | Fujimoto et al. | ............... | 257/744 |
| 2004/0004225 A1 * | 1/2004 | Sung et al. | ....................... | 257/90 |
| 2004/0137657 A1 * | 7/2004 | Dmitriev et al. | ................ | 438/47 |
| 2004/0175904 A1 * | 9/2004 | Wu et al. | ........................ | 438/478 |
| 2007/0029568 A1 * | 2/2007 | Choo et al. | ........................ | 257/99 |
| 2008/0265265 A1 * | 10/2008 | Xiong et al. | ..................... | 257/97 |

* cited by examiner

*Primary Examiner* — Steven J Fulk
*Assistant Examiner* — Eric Ward
(74) *Attorney, Agent, or Firm* — Shun Yao; Park, Vaughan, Fleming & Dowler LLP

(57) ABSTRACT

One embodiment of the present invention provides a method for fabricating a group III-V nitride structure with an ohmic-contact layer. The method involves fabricating a group III-V nitride structure with a p-type layer. The method further involves depositing an ohmic-contact layer on the p-type layer without first annealing the p-type layer. The method also involves subsequently annealing the p-type layer and the ohmic-contact layer in an annealing chamber at a predetermined temperature for a predetermined period of time, thereby reducing the resistivity of the p-type layer and the ohmic contact in a single annealing process.

18 Claims, 4 Drawing Sheets

METHOD FOR FABRICATING A LOW-RESISTIVITY OHMIC CONTACT TO A P-TYPE III-V NITRIDE SEMICONDUCTOR MATERIAL AT LOW TEMPERATURE

RELATED APPLICATION

This application is a national-stage application of and hereby claims priority under 35 U.S.C. §120, §365(c), and §371 to PCT Application No PCT/CN2007/002617, filed 31 Aug. 2007.

BACKGROUND

1. Field of the Invention

The present invention relates to the design of semiconductor light-emitting devices. More specifically, the present invention relates to a technique for fabricating a low-resistivity ohmic contact to a p-type III-V nitride semiconductor material and a method for fabricating semiconductor light-emitting devices.

2. Related Art

Group III-V nitride compounds (e.g., GaN, InN, and AlN) and alloy-compounds (e.g., AlGaN, InGaN, and AlGAInN) have been demonstrated to generate efficient luminescence at the blue-green visible spectrum. This fact has been the driving force for their recent technological development in light-emitting diodes (LEDs) and laser diodes. For example, high-brightness LEDs using group III-V nitride materials have transformed the market for color displays and opened the door to many field applications (e.g., in traffic lights and flat-panel white light sources). In addition, UV laser diodes using group III-V nitride materials have also been widely used in scientific instrumentation, laboratories, and commercial products.

One important factor that affects the fabrication of light-emitting devices is the nature of a P-N junction. When p-type and n-type materials are placed in contact with each other, the junction behaves differently from either type of material alone. More specifically, when a forward-bias voltage is applied across the P-N junction, the carriers, namely holes from the p-type layer and electrons from the n-type layer, recombine in the P-N junction region and release energy in the form of photons. In addition, an active region can be formed by a multi-quantum-well (MQW) structure between the p-type layer and the n-type layer. This MQW structure produces a higher carrier density by restricting carriers between quantum barriers and hence increases the carrier recombination rate. The faster the carriers recombine, the more efficient a light-emitting device becomes.

Techniques for epitaxially growing an LED structure with group III-V nitride materials include, but are not limited to, metalorganic chemical vapor deposition (MOCVD), molecular beam epitaxy (MBE), and Hydride Vapor Phase Epitaxy (HVPE). Substrate materials used for epitaxial growth include sapphire ($AL_2O_3$), silicon, and silicon carbide (SiC). When Si and magnesium (Mg) are used as the donor and acceptor dopants respectively for fabricating group III-V nitride materials, it is relatively easy to obtain high carrier density in n-type nitride materials. However, high carrier density is more difficult to obtain for p-type nitride materials.

SUMMARY

One embodiment of the present invention provides a method for fabricating a group III-V nitride structure with an ohmic-contact layer. The method involves fabricating a group III-V nitride structure with a p-type layer. The method further involves depositing an ohmic-contact layer on the p-type layer without first annealing the p-type layer. The method also involves subsequently annealing the p-type layer and the ohmic-contact layer at a predetermined temperature for a predetermined period of time, thereby reducing the resistivity of the p-type layer and the ohmic contact in a single annealing process.

In a variation of this embodiment, fabricating the group III-V nitride structure involves: fabricating a buffer layer; fabricating an n-type layer; and fabricating a multi-quantum-well active layer.

In a variation of this embodiment, fabricating the group III-V nitride structure involves one or more of: metalorganic chemical vapor deposition (MOCVD), molecular beam epitaxy (MBE), and hydride vapor phase epitaxy (HVPE).

In a variation of this embodiment, depositing the ohmic-contact layer involves a physical vapor deposition process which is based on one or more of: electron-beam evaporation, filament evaporation, and sputter deposition.

In a further variation, the ohmic-contact layer includes one or more noble metals which allow absorption of hydrogen.

In a further variation, the one or more noble metals include one or more of: Pt, Ru, Rh, and Pd.

In a variation of this embodiment, annealing the p-type layer and the ohmic-contact layer involves using $N_2$ and/or $O_2$ as ambient gas.

In a variation of this embodiment, the predetermined temperature is lower than 700° C.

In a further variation, the predetermined temperature is approximately 550° C.

In a variation of this embodiment, the predetermined period of time is approximately 10 minutes.

One embodiment of the present invention provides a light-emitting device which includes a group III-V nitride structure with a p-type layer. The light-emitting device further includes an ohmic-contact layer deposited on the p-type layer without first annealing the p-type layer. In addition, the p-type layer and the ohmic-contact layer are annealed at a predetermined temperature for a predetermined period of time, whereby the resistivity of the p-type layer and the ohmic contact is significantly reduced in a single annealing process.

In a variation of this embodiment, the group III-V nitride structure further includes: a buffer layer; an n-type layer; and a multi-quantum-well active layer.

In a variation of this embodiment, the group III-V nitride structure is fabricated using one or more of: metalorganic chemical vapor deposition (MOCVD), molecular beam epitaxy (MBE), and hydride vapor phase epitaxy (HVPE).

In a variation of this embodiment, the ohmic-contact layer is deposited on the p-type layer using one or more of: electron-beam evaporation, filament evaporation, and sputter deposition.

In a variation of this embodiment, the ohmic-contact layer includes one or more noble metals which allow absorption of hydrogen.

In a further variation, the one or more noble metals include one or more of: Pt, Ru, Rh, and Pd.

In a variation of this embodiment, the p-type layer and the ohmic-contact layer are annealed in an environment where $N_2$ and/or $O_2$ is used as ambient gas.

In a variation of this embodiment, the predetermined temperature is lower than 700° C.

In a further variation, the predetermined temperature is approximately 550° C.

In a variation of this embodiment, the predetermined period of time is approximately 10 minutes.

BRIEF DESCRIPTION OF THE FIGURES

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DETAILED DESCRIPTION

Figure 1:
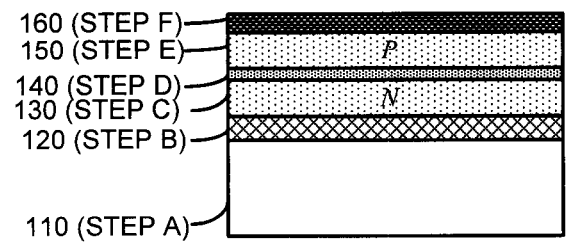
FIG. 1 illustrates an LED based on a nitride semiconductor material manufactured using a conventional metalorganic chemical vapor deposition (MOCVD) method.

During the fabrication of a p-type nitride material, hydrogen ($H_2$) is typically used as an ambient gas to increase the density of the acceptor, which is often magnesium (Mg). However, $H_2$ and Mg can form an electrically inactive Mg—H complex, which reduces dopant efficiency. As a result, a Mg-doped p-type nitride layer might have fewer active acceptors than one doped with other materials. To overcome the problem described above and to obtain a low-resistivity p-type nitride layer, low-energy electron beam irradiation (LEEBI) and/or a thermal annealing treatment in a $H_2$-free environment can be employed after the p-type nitride layer is grown. This additional process breaks down the Mg—H complex and electrically activates the acceptor.

In a thermal annealing process, the p-type nitride material can be placed in a chamber at a sufficiently high annealing temperature where nitrogen ($N_2$) is used as ambient gas. In conventional fabrication processes, the annealing temperature is preferably kept above 700° C. in order to effectively activate the acceptor. This high temperature treatment can significantly increase the carrier density and hence reduce the resistivity of the p-type layer by up to five orders of magnitude.

During the manufacturing of an LED, an ohmic-contact layer is typically formed on the top of the p-type nitride material. The formation of the ohmic-contact layer often involves alloying the p-type nitride material and a contact metal material at the contact surface. The alloying typically occurs at a temperature lower than 700° C. As a result, the p-type semiconductor material goes through a two-stage annealing/alloying process, which involves a high-temperature annealing at 700° C. or higher for activating the acceptors, followed by an alloying process at a lower temperature, for example 550° C., for the formation of the ohmic contact. In the following disclosure, for simplicity, this two-stage annealing/alloying process is referred to as the two-stage annealing process.

This two-stage annealing process has several disadvantages. For example, the minimum annealing temperature of 700° C. is very close to the growth temperature for the nearby MQW structure. This high annealing temperature could potentially damage the MQW region. In addition, the setting of two different annealing temperatures increases the complexity of the manufacturing process. Embodiments of the present invention provide a method for manufacturing a low-resistivity p-type nitride semiconductor material and forming an ohmic contact in a single annealing process at a low temperature.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

Embodiments of the present invention provide a method for fabricating a high-quality low-resistivity p-type nitride material at an annealing temperature lower than that used in a conventional method. The disclosed method streamlines the process for manufacturing a p-type nitride material by maintaining an annealing temperature lower than 700° C. for both thermal annealing and ohmic-contact alloying in a single annealing session. The resistivity of the resulting p-type material can be less than 10 Ω·cm. More importantly, this low-resistivity p-type material and the associated ohmic contact can be manufactured without affecting the quality of an adjacent MQW active region using the disclosed method.

FIG. 1 illustrates an LED based on a nitride semiconductor material manufactured using a conventional metalorganic chemical vapor deposition (MOCVD) method. Group III-V compound semiconductors include group III materials such as Al, Ga, and In, and group V materials such as N, P, and As. In one embodiment, the dopant materials used to manufacture the p-type material include Mg. These dopant materials increase carrier density in p-type semiconductor materials.

In a nitride LED fabrication process, a group III-V nitride layered structure is first fabricated on a growth substrate 110 (step A). Next, a buffer layer 120 is fabricated on substrate 110 (step B). A group III-V nitride n-type layer 130 is then fabricated on buffer layer 120 (step C). In steps D and E, a MQW active layer 140 and a group III-V p-type nitride layer 150 are formed separately on n-type layer 130. MOVCD can be used to fabricate these layers.

In one embodiment, subsequent to step E and prior to growth of any additional layers over p-type layer 150, the layered structure is placed in an annealing chamber where $N_2$ is used as the ambient gas and the ambient temperature is set at 700° C. or higher. This annealing process typically lasts for approximately 20 minutes and it disassociates H from the Mg—H complex formed in p-type layer 150. As a result, the resistivity of p-type layer 150 can be reduced by up to five orders of magnitude (e.g., from approximately $10^5$ Ω·cm to $10^0$ Ω·cm). Note that in general, a higher annealing temperature results in lower resistivity in the p-type layer. However, a high annealing temperature could damage the neighboring MQW structure. Therefore, the efficacy of the conventional annealing process is limited.

In step F, an ohmic-contact layer 160 is formed on p-type layer 150. In one embodiment, step F uses a physical vapor deposition method (e.g., electron-beam evaporation, filament evaporation, and/or sputter deposition). Conventional ohmic-contact materials include gold (Au) and nickel (Ni). Typically, a low-resistivity ohmic contact is formed between ohmic-contact layer 160 and p-type layer 150 when the structure undergoes an alloying process at a temperature of 500° C. or higher. Note that in conventional fabrication processes, the thermal annealing and the alloying of the ohmic contact are two separate processes. This is because the efficacy of thermal annealing of the p-type layer can be reduced by the presence of the ohmic-contact layer, which prevents hydrogen from being extracted from the H—Mg complex.

Figure 2:
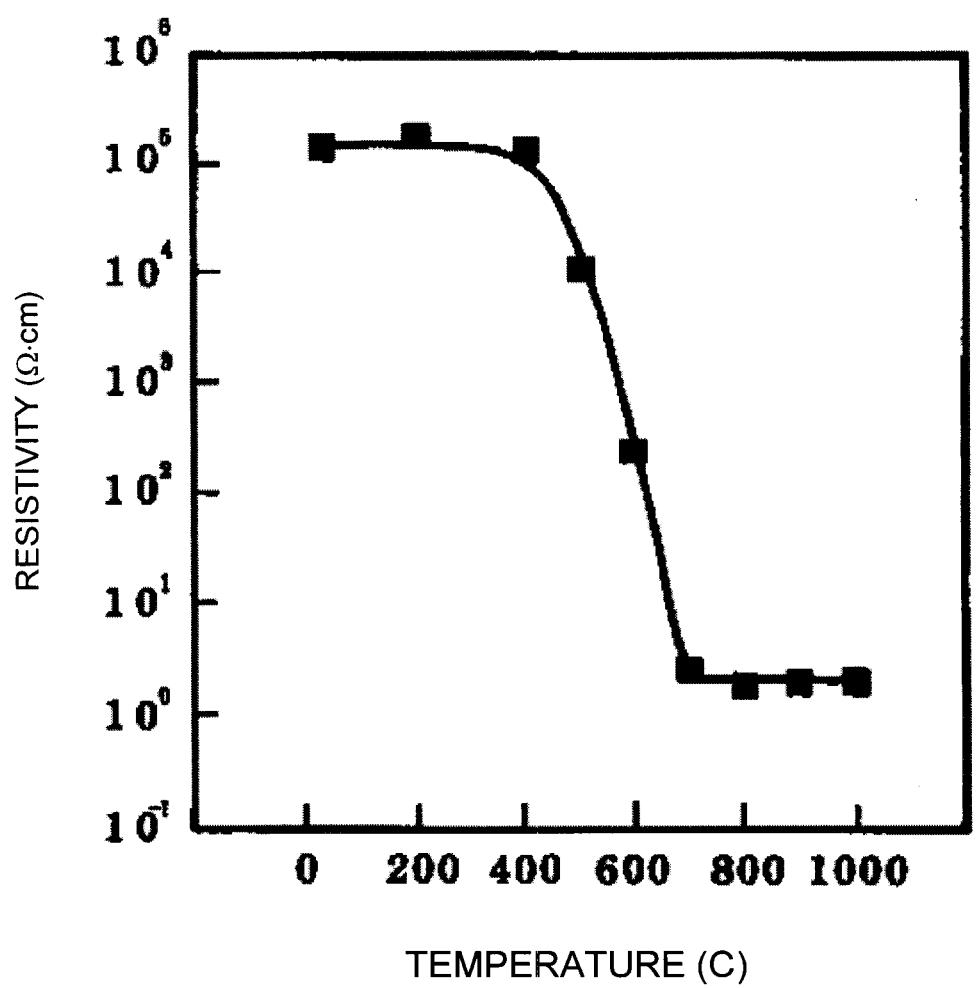
FIG. 2 illustrates a conventional two-step annealing process for activating dopants in the p-type layer and reducing resistivity of the ohmic-contact layer.

FIG. 2 illustrates a conventional two-step annealing process for activating dopants in the p-type layer and reducing resistivity of the ohmic-contact layer. As disclosed in Japan published patent application JP 2003-347592, A, this plot illustrates the resistivity change in response to different annealing temperatures in a 4-μm thick p-type GaN layer doped with Mg after 10 minutes of annealing in a $N_2$ environment. As can be observed from this plot, prior to the fabrication of an ohmic-contact layer, the resistivity of the p-type layer can only be significantly reduced with an annealing temperature considerably higher than 600° C. Typically, an annealing temperature higher than 700° C. is required to achieve a desirable resistivity in the p-type layer.

Figure 3:
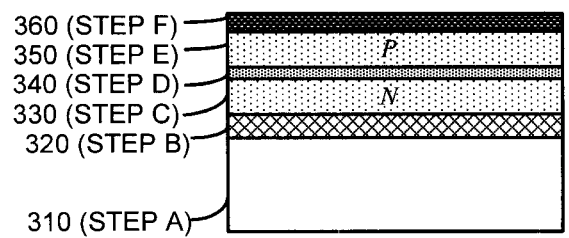
FIG. 3 illustrates an LED using a nitride semiconductor material manufactured in accordance with one embodiment of the present invention.

FIG. 3 illustrates an LED using a nitride semiconductor material manufactured in accordance with one embodiment of the present invention. In one embodiment, the epitaxial growth of III-V nitride semiconductors in the disclosed method is based on a conventional MOCVD method, and the first four steps in FIG. 3 (steps A through D) are substantially similar to those shown in FIG. 1. In short, a group III-V nitride layered structure is fabricated on a growth Si substrate 310 on which a buffer layer 320 is previously fabricated. Above buffer layer 320 is a group III-V n-type nitride layer 330 on which a MQW active layer 340 and a p-type layer 350 are formed separately (steps D and E).

Unlike conventional methods, the disclosed method continues to fabricate an ohmic-contact layer 360 on p-type layer 350 without first subjecting p-type layer 350 to an annealing process (step F). That is, ohmic-contact layer 360 is formed on p-type layer 350 without p-type layer 350 first undergoing a thermal annealing process. This is counter intuitive because the efficacy of annealing is typically reduced if there is another layer of material above the p-type layer The ohmic-contact layer comprises one or more metals which can absorb hydrogen. In one embodiment, the ohmic-contact layer includes Pt. In further embodiments, the ohmic-contact layer can include at least one of: Pt, Ruthenium (Ru), Rhodium (Rh), and Palladium (Pd). The ohmic-contact layer can be fabricated using a physical vapor deposition method (e.g., electron-beam evaporation, filament evaporation, and/or sputter deposition).

After ohmic-contact layer 360 is formed, the layered structure is placed in an annealing chamber with an ambient temperature lower than that in a conventional method, e.g., 700° C. In one embodiment, the system can use $N_2$ and/or $O_2$ as ambient gas to facilitate the annealing process. For example, this annealing temperature can be approximately 550° C., which is significantly lower than 700° C. as used in conventional annealing processes. The annealing process can last approximately 10 minutes. This annealing process disassociates H from the H—Mg complex in p-type layer 350 and also completes the alloying process which facilitates the formation of low-resistivity ohmic contact in a single process. As a result, the resistivity of the p-type layer can be reduced by up to five orders of magnitude at a temperature lower than that in a conventional method.

The noble metal used in the ohmic-contact layer can absorb hydrogen through a chemisorption process in which hydrogen molecule adheres to the surface of the noble metal through the formation of a chemical bond. The noble metals that can be used as the ohmic-contact material which also facilitates the p-type layer annealing include Pt, Ru, Rh, and Pd. In one embodiment, Pt is used as the ohmic-contact material because it is resistant to subsequent etching processes.

Note that embodiments of the present invention can be applied to various device structures and should not be limited to the specific structure described in FIG. 3. For example, the growth substrate can be based on Si, Sapphire, and/or SiC. The active region can include MQW or a P-N junction.

Figure 4:
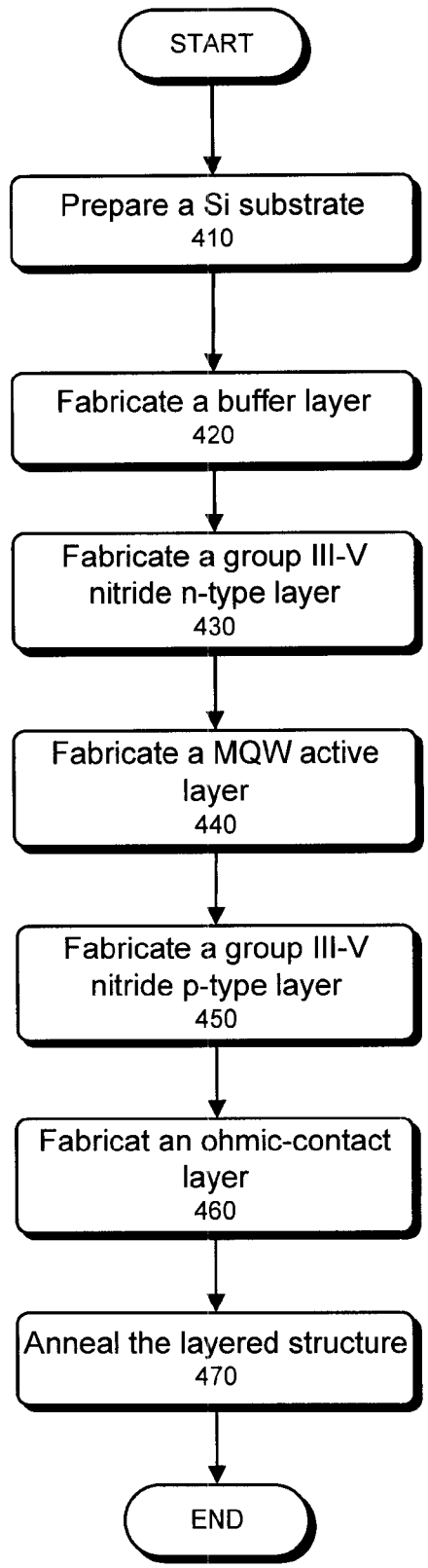
FIG. 4 is a flowchart illustrating the fabrication process of an LED based on nitride semiconductor materials manufactured in accordance with one embodiment of the present invention.

FIG. 4 is a flowchart illustrating the fabrication process of an LED based on nitride semiconductor materials manufactured in accordance with one embodiment of the present invention. The process starts with preparing a Si substrate (step 410). Next, a buffer layer is fabricated on growth Si substrate (step 420) and, subsequently, an n-type layer is fabricated on buffer layer (step 430). In steps 440 and 450, a MQW layer and a p-type layer are formed separately on n-type layer. MOVCD can be used to fabricate these layers.

After the above layers are formed, an ohmic-contact layer is fabricated on top of p-type layer in step 460. The layered structure is placed in an annealing chamber with an ambient temperature lower than that in a conventional method (step 470). For example, the annealing temperature can be approximately 550° C., which is significantly lower than 700° C. as used in conventional annealing processes. The annealing process can last approximately 10 minutes.

The aforementioned annealing process of fabricating a p-type nitride semiconductor material and forming an ohmic-contact layer produces a p-type semiconductor material with high carrier density and high activation efficiency. In particular, this method facilitates the annealing of a p-type layer at a relatively low temperature without degrading the crystal structure of an nearby MQW active region and allows the p-type dopant activation and ohmic-contact formation to be completed with a single annealing session. Therefore, light-emitting devices manufactured using the disclosed method can be fabricated more efficiently.

The invention is illustrated with different embodiments, described in detail, and with examples for purposes of facilitating the implementation of the different features or components of the invention. However, it is not the intent of the inventors to limit the application of the invention to the details shown. Modification of the features or components of the invention can be made without deviating from the spirit of the invention and thus still remains within the scope of the claims.

What is claimed is:

1. A method for fabricating a group III-V nitride structure with an ohmic-contact layer, the method comprising:

fabricating a group III-V nitride structure with a p-type layer, wherein the p-type layer includes a Mg—H complex;

depositing an ohmic-contact layer on the p-type layer without subjecting the p-type layer to a thermal annealing process that disassociates H atoms from the Mg—H complex; and subsequent to depositing the ohmic-contact layer, performing a single annealing process consisting of rapid thermal annealing to simultaneously disassociate the H atoms from the Mg—H complex in the p-type layer and alloy the ohmic-contact layer with the p-type layer at a predetermined temperature for a predetermined period of time, thereby reducing the resistivity of the p-type layer and forming a low-resistivity ohmic contact in a single annealing process, wherein the resistivity of the p-type layer is reduced to less than 10 ohm·cm, and wherein the single annealing process consisting of rapid thermal annealing uses $O_2$ as ambient gas.

2. The method of claim 1, wherein fabricating the group III-V nitride structure further comprises:

fabricating a buffer layer;
fabricating a n-type layer; and
fabricating a multi-quantum-well active layer.

3. The method of claim 1, wherein fabricating the group III-V nitride structure comprises one or more of:
   metalorganic chemical vapor deposition (MOCVD);
   molecular beam epitaxy (MBE); and
   hydride vapor phase epitaxy (HVPE).

4. The method of claim 1, wherein depositing the ohmic-contact layer comprises a physical vapor deposition process which is based on one or more of: electron-beam evaporation, filament evaporation, and sputter deposition.

5. The method of claim 4, wherein the ohmic-contact layer comprises one or more noble metals which allow absorption of hydrogen.

6. The method of claim 5, wherein the one or more noble metals include one or more of: Pt, Ru, Rh, and Pd.

7. The method of claim 1, wherein the predetermined temperature is lower than 700° C.

8. The method of claim 7, wherein the predetermined temperature is approximately 550° C.

9. The method of claim 1, wherein the predetermined period of time is approximately 10 minutes.

10. A light-emitting device, comprising:
    a group III-V nitride structure with a p-type layer, wherein the p-type layer includes a Mg—H complex; and
    an ohmic-contact layer deposited on the p-type layer without subjecting the p-type layer to a thermal annealing process that disassociates H atoms from the Mg—H complex,
    wherein the p-type layer and the ohmic-contact layer are annealed in a single annealing process consisting of rapid thermal annealing, wherein the single annealing process consisting of rapid thermal annealing is performed subsequently to deposition of the ohmic-contact layer, wherein the single annealing process consisting of rapid thermal annealing uses $O_2$ as ambient gas, and wherein the single annealing process consisting of rapid thermal annealing simultaneously disassociates the H atoms from the Mg—H complex in the p-type layer and alloys the ohmic-contact layer with the p-type layer, at a predetermined temperature for a predetermined period of time; and
    whereby the resistivity of the p-type layer and the ohmic-contact layer is significantly reduced in the single annealing process, wherein the resistivity of the p-type layer is reduced to less than 10 ohm·cm.

11. The light-emitting device of claim 10, wherein the group III-V nitride structure further comprises:
    a buffer layer;
    an n-type layer; and
    a multi-quantum-well active layer.

12. The light-emitting device of claim 10, wherein the group III-V nitride structure is fabricated using one or more of:
    metalorganic chemical vapor deposition (MOCVD);
    molecular beam epitaxy (MBE); and
    hydride vapor phase epitaxy (HVPE).

13. The light-emitting device of claim 10, wherein the ohmic-contact layer is deposited on the p-type layer using one or more of: electron-beam evaporation, filament evaporation, and sputter deposition.

14. The light-emitting device of claim 10, wherein the ohmic-contact layer comprises one or more noble metals which allow absorption of hydrogen.

15. The light-emitting device of claim 14, wherein the one or more noble metals include one or more of Pt, Ru, Rh, and Pd.

16. The light-emitting device of claim 10, wherein the predetermined temperature is lower than 700° C.

17. The light-emitting device of claim 16, wherein the predetermined temperature is approximately 550° C.

18. The light-emitting device of claim 10, wherein the predetermined period of time is approximately 10 minutes.

* * * * *